United States Patent
Xu et al.

(10) Patent No.: US 10,785,277 B2
(45) Date of Patent: Sep. 22, 2020

(54) METHODS AND DEVICES FOR ENCODING AND DECODING BINARY DATA

(71) Applicant: ALIBABA GROUP HOLDING LIMITED, Grand Cayman (KY)

(72) Inventors: Dafeng Xu, Hangzhou (CN); Sanping Li, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 0 days.

(21) Appl. No.: 16/380,643

(22) Filed: Apr. 10, 2019

(65) Prior Publication Data
US 2019/0245906 A1    Aug. 8, 2019

Related U.S. Application Data

(63) Continuation of application No. PCT/CN2017/103429, filed on Sep. 26, 2017.

(30) Foreign Application Priority Data

Oct. 11, 2016   (CN) .......................... 2016 1 0887650

(51) Int. Cl.
*G06F 15/16* (2006.01)
*H04L 29/06* (2006.01)
(Continued)

(52) U.S. Cl.
CPC .............. *H04L 65/607* (2013.01); *G06F 5/00* (2013.01); *H03M 7/00* (2013.01); *H03M 7/04* (2013.01);
(Continued)

(58) Field of Classification Search
CPC ....... H04L 65/607; H04L 1/00; H04L 1/0014; H04L 1/0041; H04L 1/0045; H04L 67/06; H03M 7/00; H03M 7/04; G06F 5/00
See application file for complete search history.

(56) References Cited

U.S. PATENT DOCUMENTS 4,597,057 A    6/1986 Snow
4,789,852 A    12/1988 Bailey et al.
(Continued)

FOREIGN PATENT DOCUMENTS

CN    1466342 A    1/2004
CN    1494330 A    5/2004
(Continued)

OTHER PUBLICATIONS

Office Action for Korean Application No. 10-2019-7013004 dated Jan. 21, 2020 (5 pages).
(Continued)

*Primary Examiner* — Richard G Keehn
(74) *Attorney, Agent, or Firm* — Sheppard Mullin Richter & Hampton LLP

(57) ABSTRACT

Methods, systems, and apparatus, including computer programs encoded on computer storage media, for encoding binary data are provided. One of the methods includes: obtaining a multimedia file from a storage device, extracting multiple bytes of binary data from the multimedia file, converting the binary data into 7-bit encoded data using an encoding algorithm, and sending one or more signals comprising the 7-bit encoded data to a remote computing device. The converting includes identifying multiple bits of data, each corresponding to a predetermined bit position of one of the bytes of binary data, generating one or more bytes of combined-bit data by combining the identified bits of data, generating one or more bytes of remaining-bit data, and generating the 7-bit encoded data by concatenating the one or more bytes of combined-bit data and the one or more bytes of remaining-bit data.

19 Claims, 3 Drawing Sheets

(51) Int. Cl.
  *H04L 29/08* (2006.01)
  *H03M 7/00* (2006.01)
  *H04L 1/00* (2006.01)
  *H03M 7/04* (2006.01)
  *G06F 5/00* (2006.01)

(52) U.S. Cl.
  CPC .............. *H04L 1/00* (2013.01); *H04L 1/0014* (2013.01); *H04L 1/0041* (2013.01); *H04L 1/0045* (2013.01); *H04L 67/06* (2013.01)

(56) References Cited

U.S. PATENT DOCUMENTS

| | | | |
|---|---|---|---|
| 5,007,013 | A | 4/1991 | Elms |
| 5,136,291 | A | 8/1992 | Teague |
| 5,406,279 | A | 4/1995 | Anderson et al. |
| 5,406,280 | A | 4/1995 | Cogan et al. |
| 5,771,238 | A | 6/1998 | Sutton |
| 5,818,032 | A | 10/1998 | Sun et al. |
| 5,974,464 | A | 10/1999 | Shin et al. |
| 6,026,198 | A | 2/2000 | Okada |
| 6,801,625 | B1 * | 10/2004 | Dealy ................. H04L 9/0625 380/28 |
| 7,190,257 | B2 | 3/2007 | Maltseff et al. |
| 7,451,229 | B2 | 11/2008 | Klemets et al. |
| 7,769,904 | B2 | 8/2010 | Eller |
| 8,078,860 | B2 | 12/2011 | Bhansali et al. |
| 2005/0123283 | A1 | 6/2005 | Li |
| 2014/0204994 | A1 * | 7/2014 | Altmann ................ H04N 19/46 375/240.01 |
| 2014/0344553 | A1 | 11/2014 | Hughes et al. |
| 2017/0338834 | A1 | 11/2017 | Shibata |

FOREIGN PATENT DOCUMENTS

| | | | |
|---|---|---|---|
| CN | 1703108 | A | 11/2005 |
| CN | 1758756 | A | 4/2006 |
| CN | 1816170 | A * | 8/2006 |
| CN | 1816170 | A | 8/2006 |
| CN | 1937582 | A | 3/2007 |
| CN | 101080038 | A | 11/2007 |
| CN | 100425081 | C | 10/2008 |
| CN | 101840394 | A | 9/2010 |
| CN | 103067022 | A | 4/2013 |
| CN | 105740215 | A | 7/2016 |
| JP | 2000307431 | A | 11/2000 |
| KR | 101380265 | B1 | 4/2014 |
| WO | 1992010035 | A1 | 6/1992 |
| WO | 1994021051 | A1 | 9/1994 |
| WO | 2016132430 | A1 | 8/2016 |

OTHER PUBLICATIONS

Office Action for Russian Application No. 2019113976/08(026949) dated Jan. 22, 2020 (10 pages).
Office Action for Canadian Application No. 3,040,003 dated Feb. 3, 2020 (4 pages).
Office Action for Australian Application No. 2017342863 dated Dec. 11, 2019 (3 pages).
First Search Report for Chinese Application No. 201610887650.1 dated Jan. 4, 2020, (1 page).
Written Opinion of the International Searching Authority and International Search Report for PCT Application No. PCT/CN2017/103429 dated Dec. 29, 2017 (12 pages).
International Preliminary Report on Patentability Chapter I for PCT Application No. PCT/CN2017/103429 dated Apr. 25, 2019 (9 pages).
Non-final rejection for Taiwanese Application No. 106131352 dated Nov. 9, 2018 (6 pages).
Decision to reject for Taiwanese Application No. 106131352 dated May 16, 2019 (4 pages).
Search Report for European Application No. 17860029.2 dated Apr. 17, 2020.
Anonymous, "Binary Data in JSON String. Something better than Base64—Stack Overflow", Internet Article, Sep. 22, 2013.

* cited by examiner

METHODS AND DEVICES FOR ENCODING AND DECODING BINARY DATA

CROSS-REFERENCE TO RELATED APPLICATIONS

This application is a continuation application of International Application No. PCT/CN2017/103429, filed on Sep. 26, 2017, which is based on and claims priority to and benefits of Chinese Patent Application No. 201610887650.1 filed with the State Intellectual Property Office (SIPO) of the People's Republic of China on Oct. 11, 2016. The entire contents of the above-identified applications are incorporated herein by reference.

TECHNICAL FIELD

This application relates to the technical field of network communications, particularly to a method and device for encoding binary data and a method and device for decoding binary data.

BACKGROUND ART

In computers, many resources are stored in the form of binary data, such as pictures, audio/video streams, and executable programs. The files containing these resources typically are all binary files. However, in some network protocols or network applications, the only data that can be transmitted correctly are universal characters. When binary data is transmitted based on these network protocols or network applications, it first needs to be encoded into character data at the transmitting end. After it is transmitted to the receiving end, the character data is decoded into binary data.

In current technologies, Base64 is the most popular binary data encoding and decoding technology. Base64 uses 64 characters to encode binary data. For N bytes of binary data, each six continuous bits in the corresponding 8*N bits are segregated as one part. The value of each part is in the range of 0~63. This value corresponds to an ASCII (American Standard Code for Information Interchange) character. The ASCII characters to which all parts correspond are spliced up to obtain a Base64 code of binary data. The corresponding decoding process is reverse to the foregoing encoding process and is not described here in more detail.

Clearly, for 3 bytes of binary data, the length of Base64 encoded data is 4 bytes. After a binary file is converted into a Base64 encoded file, the file length increases by about 33%. That is to say, a binary file will occupy about one third more traffic in transmission after Base64 encoding. In mobile Internet applications, it is vital to all services to reduce the interaction traffic between a server side and a user's handheld device. After Base64 encoding, the character files are relatively large, making it difficult to meet the requirements of some strict application scenarios.

SUMMARY

In light of this, some embodiments provide a method for encoding binary data. The method may include obtaining binary data having a length of k bytes, where k is a natural number, and converting the k bytes of the binary data into (k+t) bytes of 7-bit encoded data using a predetermined encoding algorithm. Here, t is a minimum integer that is greater than or equal to k divided by 7.

Other embodiments provide a method for decoding binary data. The method may include obtaining to-be-decoded 7-bit encoded data having a length of p bytes, where p is a natural number greater than 1, and converting the p bytes of 7-bit encoded data into (p−t) bytes of binary data using a predetermined decoding algorithm. Here, t is a minimum integer that is greater than or equal to p/8.

Some embodiments provide a device for encoding binary data. The device may include a binary data obtaining unit, for obtaining binary data having a length of k bytes, where k is a natural number. The device may also include a 7-bit encoding unit, for converting the k bytes of binary data into (k+t) bytes of 7-bit encoded data using a predetermined encoding algorithm, where t is a minimum integer that is greater than or equal to k divided by 7.

Other embodiments provide a device for decoding binary data. The device may include a to-be-decoded data obtaining unit, for obtaining to-be-decoded 7-bit encoded data having a length of p bytes, where p is a natural number greater than 1. The device may also include a 7-bit decoding unit, for converting the p bytes of the 7-bit encoded data into (p−t) bytes of binary data using a predetermined decoding algorithm, where t is a minimum integer that is greater than or equal to p divided by 8.

In some embodiments, the specification provides a computer-implemented method for processing a multimedia file. The method may include obtaining a multimedia file from a storage device, extracting a plurality of bytes of binary data from the multimedia file, converting the binary data into 7-bit encoded data using an encoding algorithm, and sending one or more signals comprising the 7-bit encoded data to a remote computing device. The converting may include identifying a plurality of bits of data, each corresponding to a predetermined bit position of eight bit positions of one of the bytes of binary data, generating one or more bytes of combined-bit data by combining the identified bits of data, generating one or more bytes of remaining-bit data by combining the data corresponding to the remaining seven bit positions of each of the bytes of binary data, and generating the 7-bit encoded data by concatenating the one or more bytes of combined-bit data and the one or more bytes of remaining-bit data.

According to some embodiments, the 7-bit encoded data may be sent using a network protocol compatible with a data format associated with the encoding algorithm and incompatible with binary data.

In the embodiments of the specification, the multimedia file may include an image file, an audio file, or a video file.

In some embodiments, the binary data may have a length of k bytes, where k is a natural number. The 7-bit encoded data may have a length of k+t bytes, where t is a minimum integer that is greater than or equal to k divided by 7.

According to some embodiments, the combining the identified bits of data may comprise combining the identified bits of data in an order according to an order of the bytes of binary data corresponding to the identified bits of data.

In the embodiments of the specification, the concatenating the one or more bytes of combined-bit data and the one or more bytes of remaining-bit data may include arranging the one or more bytes of remaining-bit data in an order associated with an order of the bytes of binary data and placing the one or more bytes of combined-bit data before or after the one or more bytes of remaining-bit data.

In some embodiments, the predetermined bit position may correspond to the most significant bit (or high-order bit, left-most bit) of each byte of binary data.

According to some embodiments, the specification provides a computer-implemented method for obtaining a multimedia file. The method may include receiving, from a remote computing device, one or more signals comprising a plurality of bytes of 7-bit encoded data, converting the 7-bit encoded data into binary data using a decoding algorithm, and obtaining a multimedia file based on the binary data. The converting may include identifying one or more bytes of remaining-bit data from the received 7-bit encoded data, identifying one or more bytes of combined-bit data from the received 7-bit encoded data, extracting a plurality of bits of data from the identified combined-bit data, and generating the binary data by combining each bit of the extracted data with one byte of the remaining-bit data.

In the embodiments of the specification, the 7-bit encoded data may have a length of p bytes, herein p is a natural number. The binary data may have a length of p−t bytes, wherein t is a minimum integer that is greater than or equal to p divided by 8.

In some embodiments, the identified one or more bytes of combined-bit data may be one or more first bytes of the 7-bit encoded data or one or more last bytes of the 7-bit encoded data.

According to some embodiments, the combining each bit of the extracted data with one byte of the remaining-bit data may be based on a position of the bit of the extracted data in the one or more bytes of combined-bit data and a position of the byte of the remaining-bit data among the identified bytes of the remaining-bit data.

In the embodiments of the specification, the combining each bit of the extracted data with one byte of the remaining-bit data may include removing one bit from the one byte of the remaining-bit data and inserting the bit of the extracted data at a predetermined bit position of the remaining bits of the one byte of remaining-bit data.

In some embodiments, the specification provides a system for processing a multimedia file. The system may include a processor and a non-transitory computer-readable storage medium storing instructions executable by the processor to cause the system to perform operations. The operations may include obtaining a multimedia file from a storage device, extracting a plurality of bytes of binary data from the multimedia file, converting the binary data into 7-bit encoded data using an encoding algorithm, and sending one or more signals comprising the 7-bit encoded data to a remote computing device. The converting may include identifying a plurality of bits of data, each corresponding to a predetermined bit position of eight bit positions of one of the bytes of binary data, generating one or more bytes of combined-bit data by combining the identified bits of data, generating one or more bytes of remaining-bit data by combining the data corresponding to the remaining seven bit positions of each of the bytes of binary data, and generating the 7-bit encoded data by concatenating the one or more bytes of combined-bit data and the one or more bytes of remaining-bit data.

According to some embodiments, the specification provides a system for obtaining a multimedia file. The system may include a processor and a non-transitory computer-readable storage medium storing instructions executable by the processor to cause the system to perform operations. The operations may include receiving, from a remote computing device, one or more signals comprising a plurality of bytes of 7-bit encoded data, converting the 7-bit encoded data into binary data using a decoding algorithm, and obtaining a multimedia file based on the binary data. The converting may include identifying one or more bytes of remaining-bit data from the received 7-bit encoded data, identifying one or more bytes of combined-bit data from the received 7-bit encoded data, extracting a plurality of bits of data from the identified combined-bit data, and generating the binary data by combining each bit of the extracted data with one byte of the remaining-bit data.

In some embodiments, the specification provides a non-transitory computer-readable storage medium for processing a multimedia file. The medium may be configured with instructions executable by one or more processors to cause the one or more processors to perform operations. The operations may include obtaining a multimedia file from a storage device, extracting a plurality of bytes of binary data from the multimedia file, converting the binary data into 7-bit encoded data using an encoding algorithm, and sending one or more signals comprising the 7-bit encoded data to a remote computing device. The converting may include identifying a plurality of bits of data, each corresponding to a predetermined bit position of eight bit positions of one of the bytes of binary data, generating one or more bytes of combined-bit data by combining the identified bits of data, generating one or more bytes of remaining-bit data by combining the data corresponding to the remaining seven bit positions of each of the bytes of binary data, and generating the 7-bit encoded data by concatenating the one or more bytes of combined-bit data and the one or more bytes of remaining-bit data.

According to some embodiments, the specification provides a non-transitory computer-readable storage medium for obtaining a multimedia file. The medium may be configured with instructions executable by one or more processors to cause the one or more processors to perform operations. The operations may include receiving, from a remote computing device, one or more signals comprising a plurality of bytes of 7-bit encoded data, converting the 7-bit encoded data into binary data using a decoding algorithm, and obtaining a multimedia file based on the binary data. The converting may include identifying one or more bytes of remaining-bit data from the received 7-bit encoded data, identifying one or more bytes of combined-bit data from the received 7-bit encoded data, extracting a plurality of bits of data from the identified combined-bit data, and generating the binary data by combining each bit of the extracted data with one byte of the remaining-bit data.

From the foregoing technical solution, it can be seen that in the embodiments of the specification, during encoding, a predetermined encoding algorithm is used to conduct 7-bit encoding of binary data, and during decoding, a predetermined decoding algorithm is used to restore the 7-bit encoded data to binary data. As 7 bytes of binary data may be converted into 8 bytes of 7-bit encoded data, after the binary data is converted into 7-bit encoded data, the length increases by about 14.3%. Therefore, an encoded file obtained after adoption of the technical solution of the specification is shorter than a Base64 encoded file, requires less data traffic during transmission over the network, and is suitable for an application scenario having strict requirements.

DETAILED DESCRIPTION

In some embodiments, a network protocol or network application for data transmission may support and recognize characters corresponding to decimal values 0~127 associated with an encoding algorithm. Examples of the encoding algorithms may comprise ASCII encoding, UTF-7 (Unicode Transformation Format 7), 7-bit equal-width encoding, or other suitable encoding algorithms. The network protocols may not support transmission of binary data over a network. Some embodiments may enable converting binary files into 7-bit encoded files and transmitting such 7-bit encoded files to a remote computing device according a suitable network protocol. Such 7-bit encoded files may then be decoded into binary files that are readable to the computing device receiving the files.

A 7-bit encoding algorithm may use the lowest 7 bits of 1 byte to carry data. Such an algorithm may generate 1 byte of overhead for every 7 bytes of binary data. For example, a 7-bit encoding algorithm can convert 7 bytes of binary data into 8 bytes of encoded data. Such an algorithm may efficiently convert binary data into character data with a relatively small overhead, thus enabling smaller encoded files and less data traffic required for transmission of the files over a network.

Some embodiments provide a new method for encoding binary data and a corresponding method for decoding binary data. According to some embodiments, binary data may be converted into 7-bit encoded data for transmission over a network. 7-bit encoded data received from a network may be restored into binary data for local use. Some embodiments, by using 7-bit encoding, may reduce the length of encoded data and save the traffic consumed by encoded data during network transmission.

The embodiments of the specification may be applied to any equipment with computing and storage capabilities. For example, the equipment may be a mobile phone, a tablet computer, a PC (Personal Computer), a notebook computer, a server, a virtual machine, or any other physical equipment or logical equipment. Alternatively, the functions in the embodiments of the specification may be achieved collaboratively by two or more pieces of physical or logical equipment assuming different duties, wherein the encoding method and the decoding method may run on different equipment respectively or on the same equipment.

Figure 1:
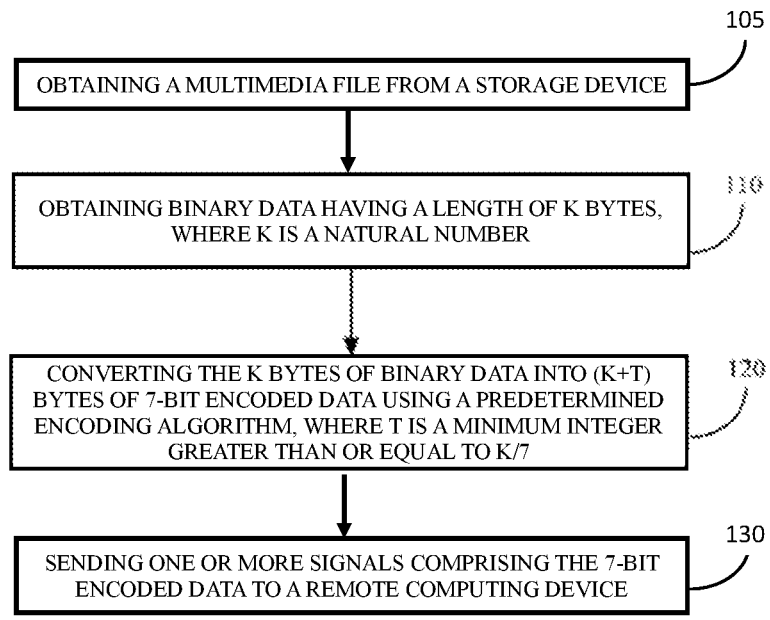
FIG. 1 is a flow diagram of a method for encoding binary data in an embodiment of the specification.

In some embodiments, the flow of a method for encoding binary data is shown in FIG. 1.

At Step 105, a computing device carrying out the method may obtain a multimedia file from a storage device and at Step 110, the computing device may obtain binary data. In some embodiments, the to-be-converted binary data may be a binary file, or a segment of binary data as a part of a file. The binary data may be read from the storage location of a specific network, or the to-be-converted binary data may be obtained from a designated cache. In some embodiments, the binary data may be extracted from a multimedia file, which may comprise, for example, an image file, an audio file, a video file, other suitable files, or any combination thereof. In other embodiments, the binary data may be extracted from a file associated with an executable application or another suitable file.

Let the length of the obtained binary data be k (k is a natural number) bytes.

Step 120, converting the k bytes of binary data into (k+t) bytes of 7-bit encoded data using a predetermined encoding algorithm, where t is a minimum integer greater than or equal to k/7.

One byte of binary data has 8 effective bits, while one byte of 7-bit encoded data has 7 effective bits. Here, an effective bit may be a bit that stores information corresponding to content of a data file. Therefore, when binary data is converted into 7-bit encoded data, 1-7 bytes of binary data may be expressed with 2-8 bytes of 7-bit encoded data respectively, and the length increased after encoding is 1 byte; 8-14 bytes of binary data may be expressed with 10-16 bytes of 7-bit encoded data respectively, and the length increased after encoding is 2 bytes. In the same way, k bytes of binary data may be expressed with (k+t) bytes of 7-bit encoded data, where t is a minimum integer greater than or equal to k/7. In other words, when k bytes of binary data are converted into 7-bit encoded data, the length increased is t bytes.

Any algorithm that may perform one-to-one mapping of k bytes of binary data into (k+t) bytes of 7-bit encoded data may be used as a predetermined encoding algorithm.

At Step 130, the computing device may send one or more signals comprising the 7-bit encoded data to a remote computing device. In some embodiments, after converting binary data into 7-bit encoded data, a device may send one or more signals or signal streams comprising the 7-bit encoded data to a remote computing device. It may use a network protocol to send the 7-bit encoded data. In some embodiments, the network protocol used may be compatible with a data format associated with the encoding algorithm but incompatible with binary data. The conversion from binary data to the 7-bit encoded data enables the transmission of the data over the network.

Figure 2:
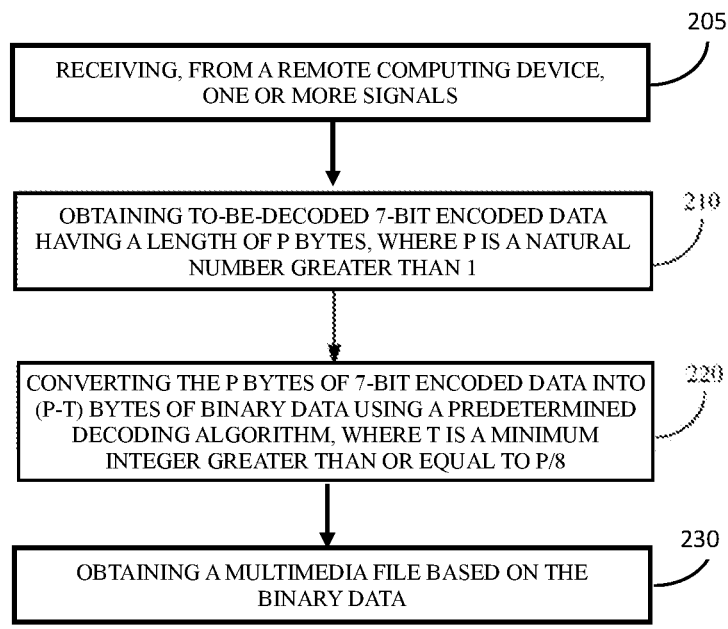
FIG. 2 is a flow diagram of a method for decoding binary data in an embodiment of the specification.

In some embodiments, the flow of a method for decoding binary data is as shown in FIG. 2.

At Step 205, a computing device carrying out this method may receive, from a remote computing device, one or more signals comprising 7-bit encoded data. At Step 210, the computing device may obtain to-be-decoded 7-bit encoded data. In some embodiments, the 7-bit encoded data may be received from a remote computing device. The data may be received as part of one or more signals or a signal stream. The sending device and the receiving device of the data may communicate using a network protocol compatible with a format of the 7-bit encoded data. In some embodiments, the network protocol may be incompatible with binary data. Although the information transmitted may originally be in the format of binary data, transmission of such information may have required conversion of such data into 7-bit encoded data.

Similarly, the to-be-decoded 7-bit encoded data may be an encoded file, or a segment of 7-bit encoded data as a part of a file. The 7-bit encoded data may be read from the storage location of a specific network, or the to-be-decoded 7-bit encoded data may be obtained from a designated cache.

Let the length of the to-be-decoded 7-bit encoded data be p (p is a natural number greater than 1) bytes.

Step 220, converting the p bytes of the 7-bit encoded data into (p−t) bytes of binary data using a predetermined decoding algorithm, where t is a minimum integer greater than or equal to p/8.

As described above, 2-8 bytes of 7-bit encoded data may express 1-7 bytes of binary data respectively, and the length reduced after decoding is 1 byte; 10-16 bytes of 7-bit encoded data may express 8-14 bytes of binary data respectively, and the length reduced after decoding is 2 bytes. In the same way, p bytes of 7-bit encoded data may express (p−t) bytes of binary data, where t is a minimum integer greater than or equal to p/8. In other words, when p bytes of 7-bit encoded data are converted into binary data, the length reduced is t bytes.

An algorithm that reverts the predetermined encoding algorithm used when binary data is converted into 7-bit encoded data and that can restore p bytes of 7-bit encoded data to (p−t) bytes of pre-encoding binary data may be used as a predetermined decoding algorithm in the embodiments of the specification.

In some embodiments, the binary data obtained based on the decoding may correspond an image file, an audio file, a video file, an executable application, other suitable files, or any combination thereof. At Step 230, the computing device may obtain a multimedia file based on the binary data. The device obtaining the binary data may recover the multimedia or program files associated with the binary data based on the decoded binary data. The binary data may be readily read or executed by a computing device that receives and decodes the data.

1 byte of binary data consists of 8 bits. In some embodiments, as 7-bit encoding can use only the lowest 7 bits in 1 byte, 1 byte of binary data needs to be expressed with 1 byte of 7-bit encoding and 1 bit in 1 extra byte. 1 byte of 8-bit binary data may be split into 2 parts. A specific predetermined bit (it may be any bit of bit 0-bit 7) is used as 1 bit expressed with the extra byte, and the remaining 7 bits except the predetermined bit are expressed with 1 byte of 7-bit encoding. The other 6 bits in the extra byte may be used to carry the predetermined bits of 6 other bytes of binary data. In this way, whenever 7 bytes of binary data are mapped into 7-bit encoding, 1 byte will be added, and when fewer than 7 bytes of binary data are mapped into 7-bit encoding, 1 byte will be added, too. Therefore, when k bytes of binary data are mapped into 7-bit encoding, t bytes will be added.

In some embodiments, a 7-bit encoding algorithm may identify a plurality of bits of data, each corresponding to a predetermined bit position of eight bit positions of one of the bytes of binary data. The algorithm may then generating one or more bytes of combined-bit data by combining the identified bits of data, generate one or more bytes of remaining-bit data by combining the data corresponding to the remaining seven bit positions of each of the bytes of binary data, and generating 7-bit encoded data by concatenating the one or more bytes of combined-bit data and the one or more bytes of remaining-bit data. In some embodiments, the identified bits of data may be combined in an order associated with an order of the bytes of binary data corresponding to the identified bits of data. In some embodiments, the one or more bytes of combined-bit data and the one or more bytes of remaining-bit data may be concatenated by arranging the one or more bytes of remaining-bit data in an order associated with an order of the bytes of binary data and placing the one or more bytes of combined-bit data before or after the one or more bytes of remaining-bit data.

As an example, the predetermined encoding algorithm may operate in the following manner: extracting a predetermined bit of each byte in k bytes of binary data, combining the predetermined bits into t bytes of 7-bit encoded combined-bit data according to a set bit order, using the remaining 7 bits of each byte of the k bytes of binary data as k bytes of 7-bit encoded remaining-bit data, and arranging the k bytes of 7-bit encoded remaining-bit data and the t bytes of 7-bit encoded combined-bit data according to the set byte order, thereby obtaining (k+t) bytes of 7-bit encoded data.

In some embodiments, a 7-bit decoding algorithm may identify one or more bytes of remaining-bit data from the received 7-bit encoded data, identifying one or more bytes of combined-bit data from the received 7-bit encoded data, and extracting a plurality of bits of data from the identified combined-bit data. It may then generate binary data by combining each bit of the extracted data with one byte of the remaining-bit data. In some embodiments, the identified one or more bytes of combined-bit data may be one or more first bytes of the 7-bit encoded data or one or more last bytes of the 7-bit encoded data. In some embodiments, a bit of extracted data may be combined with a byte of the remaining-bit data based on a position of the bit of the extracted data in the one or more bytes of combined-bit data and a position of the byte of the remaining-bit data among the identified bytes of the remaining-bit data. In some embodiments, a bit of extracted data may be combined with a byte of remaining-bit data by removing one bit from the one byte of the remaining-bit data and inserting the bit of the extracted data at a predetermined bit position of the remaining bits of the one byte of remaining-bit data.

As an example, during decoding, the predetermined decoding algorithm may operate in the following manner: as p is equal to (k+t), p bytes of 7-bit encoded data contain t bytes of 7-bit encoded combined-bit data and k bytes of 7-bit encoded remaining-bit data arranged according to a set byte order. After the t bytes of the combined-bit data and the k bytes of the remaining-bit data are identified according to the set byte order, k bits are extracted from the t bytes of the combined-bit data according to the set bit order, and each of the extracted bits are inserted to the predetermined bit of the k bytes of remaining-bit data corresponding to a set bit order of the bit, thereby obtaining k bytes of binary data.

The set bit order and the set byte order may be configured freely as long as the predetermined encoding algorithm and the predetermined decoding algorithm employ the same set bit order and set byte order. For example, the set bit order may be bit 0 to bit (s−1) or bit (s−1) to bit 0 of a byte of the combined-bit data, corresponding to s continuous (s is a natural number not greater than 7) bytes of remaining-bit data, respectively. As another example, the set byte order may be k bytes of remaining-bit data before t bytes of combined-bit data, or t bytes of combined-bit data before k bytes of remaining-bit data, and the k bytes of remaining-bit data are arranged according to the corresponding binary data.

Here are two examples for some embodiments.

Example 1

Figure 3:
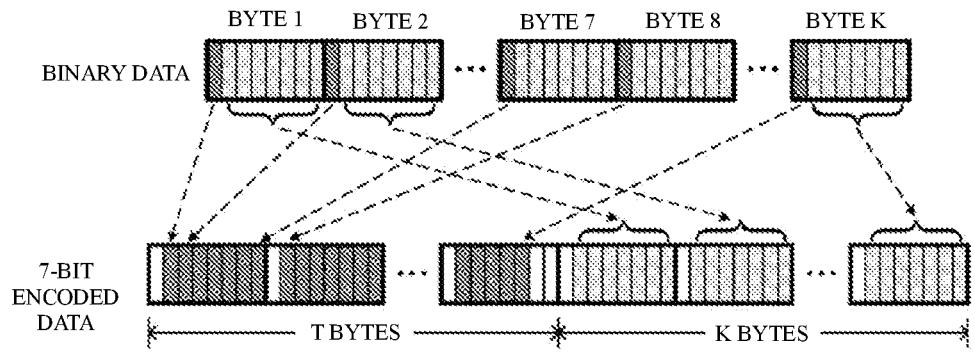
FIG. 3 is a schematic diagram of an example of a predetermined encoding algorithm in an embodiment of the specification.

Please refer to FIG. 3. In a predetermined encoding algorithm, the most significant bit may be used as a predetermined bit, and the most significant bits (the 7$^{th}$ bits) of k bytes of binary data generate t bytes of combined-bit data in a set bit order of bit 6 to bit 0 of the first byte of combined-bit data, bit 6 to bit 0 of the second byte of combined-bit data . . . . Bit 0-bit 6 in each of the k bytes of binary data are used as the k bytes of remaining-bit data. The t bytes of the combined-bit data are arranged ahead of the k bytes of the remaining-bit data to obtain (k+t) bytes of 7-bit encoded data of k bytes of binary data.

In a predetermined decoding algorithm of the first example, the first t bytes of the p (p=k+t) bytes of 7-bit encoded data are used as combined-bit data, and the last k bytes are used as remaining-bit data. k predetermined bits are extracted from the t bytes of the combined-bit data according to a set bit order of bit 6 to bit 0 of the first byte of combined-bit data, bit 6 to bit 0 of the second byte of combined-bit data . . . . The k predetermined bits extracted in order are inserted to the most significant bits of k remaining-bit data in turn to obtain k bytes of binary data.

Example 2

Figure 4:
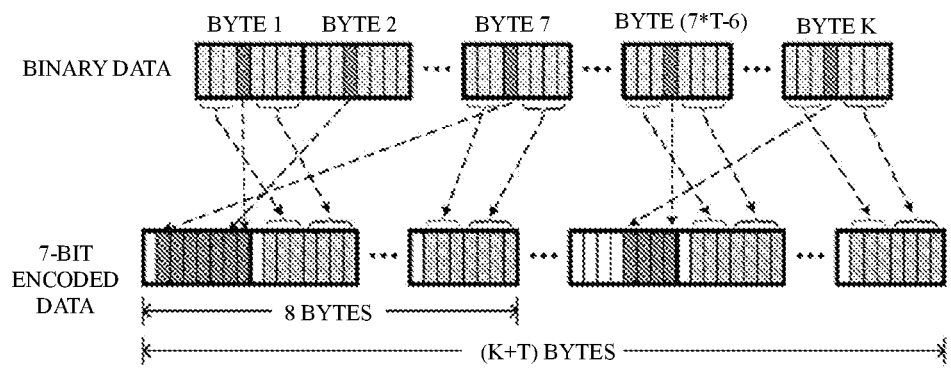
FIG. 4 is a schematic diagram of an example of an alternative predetermined encoding algorithm in an embodiment of the specification.

Please refer to FIG. 4. In another predetermined encoding algorithm, the $4^{th}$ bit is used as a predetermined bit, and 7 continuous bytes of binary data are treated as a group. If there remains fewer than 7 bytes of data, then the remaining data is also treated as a group, the k bytes of binary data will form t groups. Using a group as a unit, the predetermined bit of each byte in a group of binary data is extracted, 1 byte of combined-bit data is generated according to a set bit order from bit 0 to bit 6, and bit 5-bit 7 of each byte of binary data in the group are shifted rightwards by one bit to obtain 7-bit encoded remaining-bit data. The combined-bit data of each group is arranged ahead of the remaining-bit data of the group, and t groups are arranged using a group as a unit to obtain (k+t) bytes of 7-bit encoded data.

In the predetermined decoding algorithm of the second example, 8 continuous bytes of 7-bit encoded data are treated as a group. If there remains fewer than 8 bytes, then the remaining data is also treated as a group, then p (p=k+t) bytes of binary data will form t groups. Using a group as a unit, supposing a specific group has (s+1) (s is a natural number not greater than 7) bytes in total, then the first byte in the group is combined-bit data, and the $2^{nd}$ byte-the $(s+1)^{th}$ byte are s bytes of remaining-bit data; bit 0-bit s of the combined-bit data in the group are inserted into the $4^{th}$ bit of the $2^{nd}$ byte-the $(s+1)^{th}$ byte, respectively, of the remaining-bit data in the group to obtain s bytes of binary data. The binary data obtained from each group is arranged in order to obtain k bytes of decoded binary data.

In the embodiments of the specification, during encoding, a predetermined encoding algorithm may be used to convert binary data into 7-bit encoded data, and during decoding, a corresponding predetermined decoding algorithm is employed to restore the 7-bit encoded data to binary data. As the data length increases by about 14.3% after binary data is converted into 7-bit encoded data, which is much smaller than the length increased during Base64 encoding, the encoded files obtained after adoption of some embodiments require less traffic during transmission on the network and are suitable for an application scenario having strict requirements.

In an application example, an encoding algorithm is employed to convert the data of picture origin.jpg into 7-bit ASCII encoded data, and a corresponding decoding algorithm restores the 7-bit ASCII encoded data to binary data.

A JavaScript program for achieving the encoding method is as follows:

```
var buf = new Buffer(1024); // establishing a buffer zone used
    for encoding
var data = fs.readFileSync('origin.jpg'); // data is the binary
    data of the picture origin.jpg
var length = data.length + Math.ceil(data.length / 7); // length is
    the length of 7-bit encoded data after conversion
var body = new Buffer(length); // body is 7-bit encoded data after
    conversion
var offset = 0;
var swap = 0;
var count = 0;
for (var i = 0; i < data.length, i++) {
    swap | = ( (data [i] & 0x80) >> (i% 7 + 1) );
    count ++;
    if (i===data.length − 1 ||count % 7===0) {
        body.writeUInt8(swap, ++offset);
        swap=0;
    }
}//
``` starting from the first byte of data, the most significant bits of each 7 bytes is combined to generate ASCII encoded combined-bit data, where the most significant bit of the $7^{th}$ byte of binary data among each 7 bytes is in bit 0, and the most significant bit of the $1^{st}$ byte of binary data is in bit 6. The combined-bit data is written into body one by one until the last byte of data.

```
for (var i=0; i < data.length; i++) {
    body.writeUInt8(data [i] & 0x7f, ++offset);
}//
``` starting from the first byte of data, the lowest 7 bots of each byte is used to generate ASCII encoded remaining-bit data, and they are written into body one by one.

Suppose temp is 7-bit encoded data to be decoded, then the JavaScript program for achieving the decoding method is as follows:

```
var len=temp.length − Math.ceil(temp.length / 8); //len is the
    length of the binary data after decoding
var buf = new Buffer(len), //buf is the binary data after decoding
    for (var i = 0; i < buf.length; i++) {
        var swap = 0;
        swap | = ((temp.readUInt8 (parseInt(i / 7)) << (i% 7 + 1)) &
            0x80);
        swap | = temp.readUInt8(i+temp.length − len);
        buf.writeUInt8(swap, i);
    } //
``` the first (temp.length-len) bytes of temp are combined-bit data, and the rest is remaining-bit data; starting from the first byte of the combined data, bit 6- bit 0 of each byte are extracted in turn and inserted to the most significant bits of the remaining-bit data in turn and written into buf.

Figure 5:
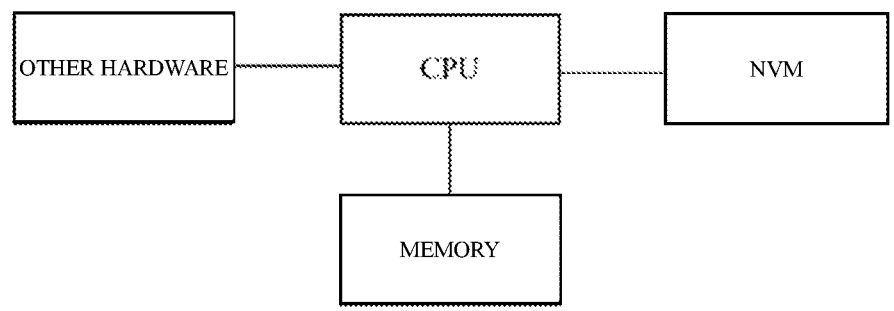
FIG. 5 is a hardware structural diagram of the equipment running an embodiment of the specification.

Corresponding to the implementation of the above flow, some embodiments further provide a device for encoding binary data and a device for decoding binary data. These two devices both may be implemented through software, through hardware, or through a combination of hardware and software. Taking implementation through software as an example, a device in a logical sense is formed through a CPU (Central Process Unit) of a piece of equipment, which reads the corresponding computer program commands to memory and runs them. In terms of hardware, in addition to a CPU, memory, and NVM (nonvolatile memory) as shown in FIG. 5, the equipment where the device for encoding binary data or the device for decoding binary data is located normally also includes other hardware such as a chip for sending and receiving radio signals and/or a board card for achieving the function of network communications.

Figure 6:
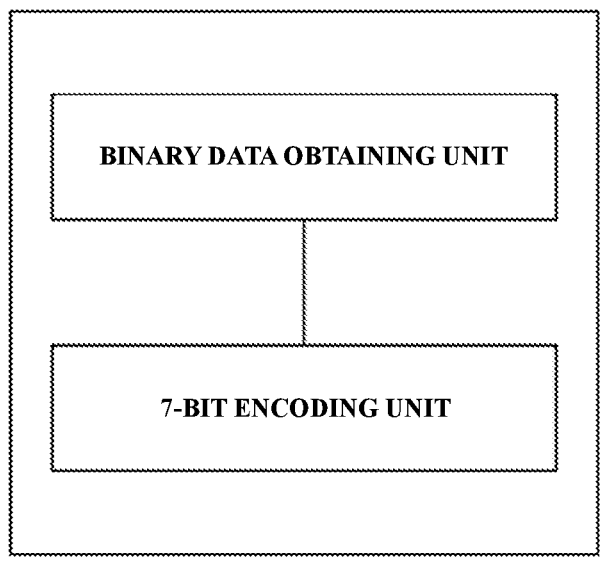
FIG. 6 is a logical structural diagram of a device for encoding binary data in an embodiment of the specification.

FIG. 6 shows a device for encoding binary data in an embodiment of the specification, comprising a binary data obtaining unit and a 7-bit encoding unit. The binary data obtaining unit is for obtaining binary data having a length of k bytes, where k is a natural number. The 7-bit encoding unit is for converting the k bytes of the binary data into (k+t) bytes of 7-bit encoded data using a predetermined encoding algorithm, where t is a minimum integer that is greater than or equal to k/7.

In some embodiments, the predetermined encoding algorithm comprises: extracting a predetermined bit of each byte of the k bytes of binary data and combining them into t bytes of 7-bit encoded combined-bit data according to a set bit order, using the remaining 7 bits of each byte of the k bytes of binary data as k bytes of 7-bit encoded remaining-bit data, and arranging the k bytes of 7-bit encoded remaining-bit data and the t bytes of 7-bit encoded combined-bit data according to a set byte order to generate 7-bit encoded data of the binary data.

According to some embodiments, the set byte order includes: the k bytes of remaining-bit data before or after the t bytes of combined-bit data, arranged according to the corresponding binary data.

In some embodiments, the set bit order includes: using the predetermined bits extracted from s continuous bytes of the binary data as bit 0 to bit (s−1) or bit (s−1) to bit 0 of 1 byte of combined-bit data, where s is a natural number not greater than 7.

According to some embodiments, the predetermined bit is the most significant bit of each byte.

Figure 7:
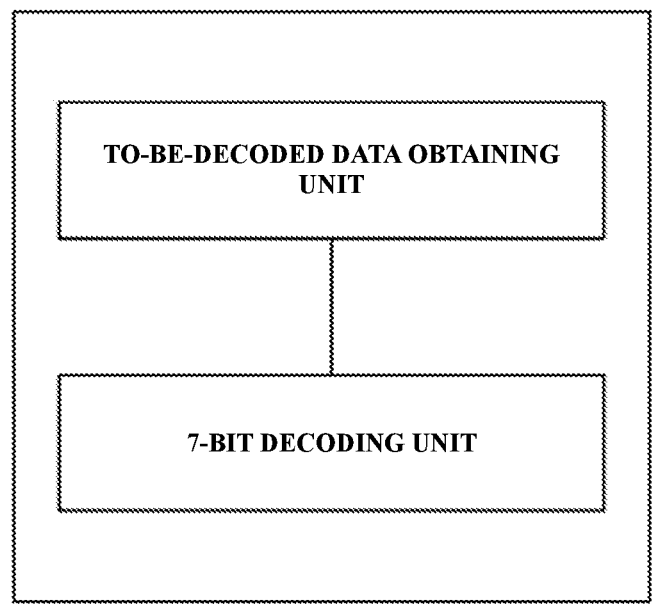
FIG. 7 is a logical structural diagram of a device for decoding binary data in an embodiment of the specification.

FIG. 7 shows a device for decoding binary data in an embodiment of the specification, comprising a to-be-decoded data obtaining unit and a 7-bit decoding unit. The to-be-decoded data obtaining unit is for obtaining to-be-decoded 7-bit encoded data having a length of p bytes, where p is a natural number greater than 1. The 7-bit decoding unit is for converting the p bytes of the 7-bit encoded data into (p−t) bytes of binary data using a predetermined decoding algorithm, where t is a minimum integer greater than or equal to p/8.

In some embodiments, the predetermined decoding algorithm comprises: obtaining k bytes of remaining-bit data and t bytes of combined-bit data from the p bytes of 7-bit encoded data according to a set byte order, where k is a difference obtained by subtracting t from p; extracting k bits from the t bytes of 7-bit encoded combined-bit data; and inserting each of the extracted bits to a predetermined bit of k bytes of remaining-bit data corresponding to the set bit order of the bit, thereby obtaining k bytes of binary data.

According to some embodiments, the set byte order includes: the k bytes of remaining-bit data before or after the t bytes of combined-bit data, arranged according to the corresponding binary data.

In some embodiments, the set bit order includes: bit 0 to bit (s−1) or bit (s−1) to bit 0 of 1 byte of combined-bit data in correspondence to s continuous bytes of remaining-bit data, respectively, where s is a natural number not greater than 7.

According to some embodiments, the predetermined bit is the most significant bit of each byte.

The foregoing descriptions are not intended to limit the specification. All modifications, equivalent substitutions, and improvements made without departing from the spirit and principle of the specification shall fall within the scope of the specification.

In a typical configuration, the computing equipment comprises one or a plurality of processors (CPU), I/O interfaces, network interfaces, and internal memories.

The internal memory may be in a form of volatile memory, random access memory (RAM), and/or non-volatile memory among computer readable media, such as read-only memory (ROM) or flash memory (flash RAM). The internal memory is an example of computer readable media.

Computer readable media include non-volatile, volatile, removable, and non-removable media and may achieve information storage by any method or technology. Information may be computer readable instructions, data structures, program modules, or other data. Examples of computer storage media include, without limitation, phase change random access memory (PRAM), static random access memory (SRAM), dynamic random access memory (DRAM) and other types of random access memory (RAM), read only memory (ROM), electrically erasable programmable read only memory (EEPROM), flash memory or other memory technologies, compact disc-read only memory (CD-ROM), digital video disk (DVD) or other optical memory, cassette type magnetic tape, tape disk memory or other magnetic storage devices, or any other non-transfer media. They may be used to store information that is accessible to computer devices. According to the definition in this document, computer readable media do not include transitory media, such as modulated data signals and carriers.

When the functions disclosed herein are implemented in the form of software functional units and sold or used as independent products, they can be stored in a processor executable non-volatile computer readable storage medium. Particular technical solutions disclosed herein (in whole or in part) or aspects that contributes to current technologies may be embodied in the form of a software product. The software product may be stored in a storage medium, comprising a number of instructions to cause a computing device (which may be a personal computer, a server, a network device, and the like) to execute all or some steps of the methods of the embodiments. The storage medium may comprise a flash drive, a portable hard drive, ROM, RAM, a magnetic disk, an optical disc, another medium operable to store program code, or any combination thereof.

Particular embodiments further provide a system comprising a processor and a non-transitory computer-readable storage medium storing instructions executable by the processor to cause the system to perform operations corresponding to steps in any method of the embodiments disclosed above. Particular embodiments further provide a non-transitory computer-readable storage medium configured with instructions executable by one or more processors to cause the one or more processors to perform operations corresponding to steps in any method of the embodiments disclosed above.

Terms "include", "contain", or their variants are intended to cover non-exclusive inclusion so that a process, method, commodity, or equipment including a series of elements not only includes these elements but also includes other elements not clearly set out, or also includes the elements inherent to such process, method, commodity or equipment. Unless otherwise limited, the elements defined by the phrasing "include one . . . " do not exclude the presence of other, similar elements in the process, method, commodity, or equipment including the elements.

Those skilled in the art should understand that the embodiments of the specification may be provided as methods, systems, or computer program products, so the specification may adopt a purely software embodiment form, a purely hardware embodiment form, or an embodiment form that combines software and hardware. Further, the specification may adopt a form of computer program product implemented on one or a plurality of computer-usable storage media (including but not limited to disk memory, CD-ROM, and optical memory) that contain computer-usable program codes.

The invention claimed is:

1. A computer-implemented method for processing a multimedia file, comprising:
   obtaining a multimedia file from a storage device;
   extracting a plurality of bytes of unencoded binary data from the multimedia file;
   converting the unencoded binary data into 7-bit encoded data using an encoding algorithm by:
      identifying a plurality of bits of data respectively from the extracted plurality of bytes of the unencoded binary data, each of the identified bits of data corresponding to a predetermined bit position of eight bit positions of a corresponding byte of the extracted plurality of bytes of the unencoded binary data;
      generating one or more bytes of combined-bit data by combining the identified bits of data;
      generating one or more bytes of remaining-bit data by combining the data corresponding to the remaining seven bit positions of each of the plurality of bytes of the unencoded binary data; and
      generating the 7-bit encoded data by concatenating the one or more bytes of combined-bit data and the one or more bytes of remaining-bit data; and
   sending one or more signals comprising the 7-bit encoded data to a remote computing device.

2. The method of claim 1, wherein:
   the one or more signals comprising the 7-bit encoded data is sent using a network protocol compatible with a data format associated with the encoding algorithm and incompatible with binary data.

3. The method of claim 1, wherein the multimedia file comprises:
   an image file;
   an audio file; or
   a video file.

4. The method of claim 1, wherein:
   the unencoded binary data has a length of k bytes, wherein k is a natural number; and
   the 7-bit encoded data has a length of k+t bytes, wherein t is a minimum integer that is greater than or equal to k divided by 7.

5. The method of claim 1, wherein the combining the identified bits of data comprises:
   combining the identified bits of data in an order according to an order of the bytes of unencoded binary data corresponding to the identified bits of data.

6. The method of claim 1, wherein the concatenating the one or more bytes of combined-bit data and the one or more bytes of remaining-bit data comprises:
   arranging the one or more bytes of remaining-bit data in an order associated with an order of the bytes of unencoded binary data; and
   placing the one or more bytes of combined-bit data before or after the one or more bytes of remaining-bit data.

7. The method of claim 1, wherein the predetermined bit position corresponds to the most significant bit of each byte of the unencoded binary data.

8. A computer-implemented method for obtaining a multimedia file, comprising:
   receiving, from a remote computing device, one or more signals comprising a plurality of bytes of 7-bit encoded data;
   converting the 7-bit encoded data into a plurality of bytes of unencoded binary data using a decoding algorithm by:
      identifying one or more bytes of remaining-bit data from the received 7-bit encoded data;
      identifying one or more bytes of combined-bit data from the received 7-bit encoded data, wherein the one or more bytes of combined-bit data is concatenated with the one or more bytes of remaining-bit data in the 7-bit encoded data;
      extracting a plurality of bits of data from the identified combined-bit data; and
      generating the plurality of bytes of the unencoded binary data by combining each bit of the extracted data with one byte of the remaining-bit data, wherein each bit of the extracted data is placed at a predetermined bit position of a corresponding byte of the plurality of bytes of the unencoded binary data; and
   obtaining a multimedia file based on the binary data.

9. The method of claim 8, wherein:
   the 7-bit encoded data has a length of p bytes, herein p is a natural number; and
   the unencoded binary data has a length of p−t bytes, wherein t is a minimum integer that is greater than or equal to p divided by 8.

10. The method of claim 8, wherein:
    the identified one or more bytes of combined-bit data is one or more first bytes of the 7-bit encoded data or one or more last bytes of the 7-bit encoded data.

11. The method of claim 8, wherein:
    the combining each bit of the extracted data with one byte of the remaining-bit data is based on a position of the bit of the extracted data in the one or more bytes of combined-bit data and a position of the byte of the remaining-bit data among the identified bytes of the remaining-bit data.

12. The method of claim 8, wherein the combining each bit of the extracted data with one byte of the remaining-bit data comprises:
    removing one bit from the one byte of the remaining-bit data; and
    inserting the bit of the extracted data at the predetermined bit position of the remaining bits of the one byte of remaining-bit data.

13. A system for processing a multimedia file, comprising a processor and a non-transitory computer-readable storage medium storing instructions executable by the processor to cause the system to perform operations comprising:
    obtaining a multimedia file from a storage device;
    extracting a plurality of bytes of unencoded binary data from the multimedia file;
    converting the unencoded binary data into 7-bit encoded data using an encoding algorithm by:
       identifying a plurality of bits of data respectively from the extracted plurality of bytes of the unencoded binary data, each of the identified bits of data corresponding to a predetermined bit position of eight bit positions of a corresponding byte of the extracted plurality of bytes of the unencoded binary data;
       generating one or more bytes of combined-bit data by combining the identified bits of data;

generating one or more bytes of remaining-bit data by combining the data corresponding to the remaining seven bit positions of each of the plurality of bytes of the unencoded binary data; and generating the 7-bit encoded data by concatenating the one or more bytes of combined-bit data and the one or more bytes of remaining-bit data; and sending one or more signals comprising the 7-bit encoded data to a remote computing device.

14. The system of claim 13, wherein:

the one or more signals comprising the 7-bit encoded data is sent using a network protocol compatible with a data format associated with the encoding algorithm and incompatible with binary data.

15. The system of claim 13, wherein the multimedia file comprises:

an image file;

an audio file; or a video file.

16. The system of claim 13, wherein:

the unencoded binary data has a length of k bytes, wherein k is a natural number; and the 7-bit encoded data has a length of k+t bytes, wherein t is a minimum integer that is greater than or equal to k divided by 7.

17. The system of claim 13, wherein the combining the identified bits of data comprises:

combining the identified bits of data in an order according to an order of the bytes of unencoded binary data corresponding to the identified bits of data.

18. The system of claim 13, wherein the concatenating the one or more bytes of combined-bit data and the one or more bytes of remaining-bit data comprises:

arranging the one or more bytes of remaining-bit data in an order associated with an order of the bytes of unencoded binary data; and placing the one or more bytes of combined-bit data before or after the one or more bytes of remaining-bit data.

19. The system of claim 13, wherein the predetermined bit position corresponds to the most significant bit of each byte of the unencoded binary data.

* * * * *